(12) United States Patent
Wang et al.

(10) Patent No.: US 7,383,530 B2
(45) Date of Patent: Jun. 3, 2008

(54) SYSTEM AND METHOD FOR EXAMINING MASK PATTERN FIDELITY

(75) Inventors: Wen-Chuan Wang, Taipei (TW);
Shih-Ming Chang, Hsinchu (TW);
Chih-Cheng Chin, Junghe (TW);
Chi-Lun Lu, Hsinchu (TW);
Sheng-Chi Chin, Hsinchu (TW);
Hung-Chang Hsieh, Hsinchu (TW)

(73) Assignee: Taiwan Semiconductor Manufacturing Company, Ltd, Hsin-Chu (TW)

( * ) Notice: Subject to any disclaimer, the term of this patent is extended or adjusted under 35 U.S.C. 154(b) by 0 days.

(21) Appl. No.: 11/786,978

(22) Filed: Apr. 13, 2007

(65) Prior Publication Data

US 2007/0250805 A1 Oct. 25, 2007

Related U.S. Application Data

(62) Division of application No. 10/665,451, filed on Sep. 19, 2003, now abandoned.

(60) Provisional application No. 60/467,977, filed on May 5, 2003.

(51) Int. Cl.
*G06F 17/50* (2006.01)

(52) U.S. Cl. .............................. 716/21; 716/19; 716/20; 430/5; 430/30

(58) Field of Classification Search ............ 716/19–21; 430/5, 30
See application file for complete search history.

(56) References Cited

U.S. PATENT DOCUMENTS

| | | | |
|---|---|---|---|
| 6,078,738 A * | 6/2000 | Garza et al. | 716/21 |
| 6,272,236 B1 * | 8/2001 | Pierrat et al. | 382/144 |
| 6,466,315 B1 | 10/2002 | Karpol et al. | |
| 6,670,082 B2 * | 12/2003 | Liu et al. | 430/5 |
| 6,821,683 B2 * | 11/2004 | Toyama et al. | 430/5 |
| 2004/0172611 A1 * | 9/2004 | Pang | 716/19 |
| 2004/0225488 A1 | 11/2004 | Wang et al. | |

* cited by examiner

*Primary Examiner*—Jack Chiang
*Assistant Examiner*—Nghia M. Doan
(74) *Attorney, Agent, or Firm*—Duane Morris LLP

(57) ABSTRACT

A method and system is disclosed for examining mask pattern fidelity. A mask picture is generated from a first mask with a first OPC model applied to a mask design. The mask picture is converted into a mask based simulation file. A first simulation is conducted under a first set of predetermined lithography processing conditions using the converted simulation file to generate one or more files of a first set representing wafer photo resist profile thereof. The first OPC model is applied to the mask design in the database mask file. A second simulation is conducted under the first set of predetermined lithography processing conditions using the OPCed mask design to generate one or more files of a second set representing wafer photo resist profile thereof. The first and second sets of files are evaluated for inspecting mask fidelity.

12 Claims, 3 Drawing Sheets

SYSTEM AND METHOD FOR EXAMINING MASK PATTERN FIDELITY

CROSS REFERENCE

This application is a divisional application of U.S. patent application Ser. No. 10/665,451, filed on Sep. 19, 2003, now abandoned the contents of which are hereby incorporated by reference as if set forth in their entirety; and this application claims the benefit of U.S. Provisional Patent Application No. 60/467,977, which was filed on May 5, 2003, and the contents of which are hereby incorporated by reference as if set forth in their entirety.

BACKGROUND

The present disclosure relates generally to integrated circuit (IC) manufacturing, and more particularly to an improved method and system for examining mask fidelity to determine an appropriate method to create a mask.

Photolithography is one of the principal processes in the manufacture of semiconductor devices, and consists of patterning the wafer's surface in accordance with the circuit design of the semiconductor devices to be produced. More specifically, a circuit design to be fabricated on the wafer is first patterned on a mask or reticle. The wafer is coated with a photo resist material, and is then placed in a photolithography tool to be exposed to light passing through the reticle to produce a latent image of the reticle on the photo resist material. Thereafter, the exposed photo resist material is developed to produce the image of the mask on the wafer. After the completion of the photolithography process, the uppermost layer of the wafer is etched, a new layer is deposited, and the photolithography and etching operations are started again. In this repetitive manner, a multi-layer semiconductor wafer is produced.

As is well known, photolithography tools utilize a lamp or a laser as a light source, and utilize a relatively high numerical aperture (NA) objective to achieve a relatively high resolution. The optics of such tools are generally designed to produce reduction (negative magnification) of the image of the reticle onto the wafer. In order to obtain operating semiconductor devices, the reticle must be defect free. Moreover, in most modern processes, the reticle is used in a repeated manner to create many dies on the wafer. Therefore, various reticle inspection tools have been developed and are available commercially.

During the photolithography process, certain entities on the mask will be distorted or lost altogether. This is referred to generally as a fidelity issue. It includes phenomenon such as line end shortening, corner rounding, and small serif disappearance, etc. Some of those are caused by errors on the masks themselves, while others can be caused by processing mistakes. When generating an actual photo mask from a digital mask design, a mask fidelity problem may occur. When circuits on the wafers are made from such a mask, certain errors will then show on the wafer.

It should be appreciated by those skilled in the art that to produce an operational microelectronic circuit, a mask must be as defect-free as possible, preferably completely defect-free. Therefore, mask inspection tools are needed to detect various defects in the masks that can potentially reduce the microelectronic circuit fabrication yields. Smaller feature sizes on the masks used in the photolithographic process, as well as the use of OPC masks, require more sensitive tools for mask inspection. Numerous systems for mask inspection have been developed in response to the growing demands for inspecting mask fidelity problems.

The earliest automated inspection tools for detecting mask errors utilized a technique termed die-to-die inspection where the acquired images of a die on the mask are compared to corresponding images of a second die from the same mask. Any difference between one die to the other die indicated the presence of a defect. The technique was limited in that certain mask surface defects (called "surface" defects, for example, a particle on the surface of a mask) could remain undetected and later appear in a critical mask region after handling of the mask.

Moreover, defects can be detected by inspecting the mask using the image of the mask produced by the light transmitted through the mask and the light reflected by one face of the mask. The mask inspection tool that uses this method acquires both images then analyzes the images. The results of the analysis of the two images yield information on the condition of the mask. The image analysis method may use die-to-die comparison, die-to-database comparison, or reflected image to transmitted image comparison. In the die-to-database method, the acquired die images from the mask images are compared to images that are simulated using the mask design specifications.

Such an inspection system can detect defects that may or may not print on the photo resist during the actual photolithographic process. The major drawback of this method is that it studies the physical structure of the mask independently of the optical image actually produced by the mask on the wafer. For instance, variations in the line width of the image that the mask produces frequently are higher than the corresponding variation in the line width of the mask itself. It is desirable, therefore, to relate the physical structure of the mask to the actual image that the mask creates on the photo resist, and to study directly the image that the mask actually produces.

In order to facilitate the evaluation of the mask performance at the wafer level, tools have been developed that are able to scan a mask and yield an aerial image of the mask as it would appear at the wafer plane. According to this method, the mask inspection system replicates an optical exposure tool's critical parameters used during the exposure of the photo resist during semiconductor device fabrication. The mask inspection device then applies a set, or a plurality of sets, of exposure conditions that may be used in the actual photolithographic process to create an aerial image, or plurality of images, from the mask. In particular, these systems match the wavelength, the partial coherence of the exposure light, illumination aperture and the imaging numerical aperture (NA) of the optical exposure system. The created aerial image is typically magnified and detected using a CCD camera that is sensitive to the ultraviolet radiation. The use of the aerial imaging method permits the detection of the mask defects that would print during the actual photolithographic process. The acquired aerial images are analyzed using software algorithms developed for defect identification.

The inspection methods based on die-to-database comparison that are used by the existing aerial imaging systems are not always effective, especially for highly complicated mask designs. The die-to-database comparison method uses models describing the behavior of an optical exposure system used in the mask manufacturing process to produce the simulated image used in the mask inspection. However, various optical and mechanical factors during the mask making process will impact the final mask. As a result, there are limitations in the accuracy of the transformation from database to simulated aerial image. In addition, after the sequence of writing, developing and etching the photo mask, certain errors may be present on the photo mask or in the realized photo mask layout which are not readily detectable as mask defects. For example, variations in the line widths of the image that the photo mask produces at the wafer plane are frequently higher than the corresponding variations in the line widths of the mask itself. This phenomenon is referred to as the Mask Error Enhancement Factor (MEEF). In effect, the MEEF describes the amplification of reticle errors realized on the wafer surface. This MEEF effect is most noticeable when the lithography involves resolving features on a semiconductor wafer which are smaller than the exposing wavelength of the light used by the exposure tool which forms the patterns on the wafers. The mask defect inspection method utilized by the mask vendor, typically specified by the customer, is often the last automated layout inspection a mask receives prior to use in the wafer facility. After receipt at the wafer fabrication facility, the mask is used to image semiconductor wafers for production of semiconductor devices While photo mask manufacturers strive to deliver zero-defect photo masks to their customers, there is a certain limit in their photo mask inspection capabilities. From the perspective of photo mask manufacturers, the ideal goal would be to create a circuit on the wafer that closely mimic what is in a digital design in a database. What is needed is an improved method and system for detecting mask fidelity problem so that it can be determined how an appropriate mask should be created.

SUMMARY

A method and system is disclosed for determining mask fidelity problems during the manufacturing of electronic circuits. A real and ideal mask simulation required digital files are generated, and go through simulations to generate results that can be compared to obtain quantitative evaluation of the fidelity problem of the mask.

A mask fidelity inspection method comprising generating a first mask picture from a first mask, the first mask being made from a predetermined mask design with a first OPC model applied thereto. A second mask picture is generated from a second mask and the second mask is made from the predetermined mask design with a second OPC model applied thereto. The first and second mask pictures are converted into a first and second mask based simulation files. A first simulation session is conducted under predetermined photolithography processing conditions using the first mask based simulation file to generate one or more files representing a first wafer photo resist profile thereof. A second simulation session is conducted under the predetermined photolithography processing conditions using the second mask based simulation file to generate one or more files representing a second wafer photo resist profile thereof. The first and second OPC models are applied to the predetermined mask design in a database mask file format. A third simulation is conducted under the predetermined photolithography processing conditions using the mask design with the first OPC model to generate one or more files representing an expected wafer photo resist profile thereof. A fourth simulation is conducted under the predetermined photolithography processing conditions using the mask design with the second OPC model to generate one or more files representing an expected wafer photo resist profile thereof. The first, second, third and fourth wafer photo resist profiles are evaluated so as to determine one of the first and second OPC models corresponding to the predetermined photolithography processing conditions.

These and other aspects and advantages will become apparent from the following detailed description, taken in conjunction with the accompanying drawings, illustrating by way of example the principles of the disclosure.

DETAILED DESCRIPTION

A method and system is disclosed for determining mask fidelity problems for manufacturing semiconductor circuits. As it is known in the industry, there are limitations in the accuracy during the transformation from mask design database to an actual mask. The actual mask is different from the mask design due to limitations of the mask-writing tool and other processing variables. After the sequence of writing, developing and etching the mask, certain errors may be present on the mask or in the realized mask layout which are not readily detectable as mask defects. For example, variations in the line width of the image that the mask produces frequently are higher than the corresponding variation in the line width of the mask itself.

One process that is done to the mask design to make a better mask is to apply an Optical Proximity Correction (OPC) process to certain entities in the mask design. Such a mask design is known as an OPCed mask design. The OPC process can take on a number of models in the hope that one of them will be the most effective so that the OPCed mask design will produce circuits that closely mimic the size and shape of the circuits in the design database.

It is hard to predict which OPC model is good for produce final circuits on the wafer. Some OPC models applied to the mask design may be "too aggressive" in terms of the modifications resulting in distorting features on the wafer. Further, if one only compares an actual mask with a particular OPCed mask design layout, some final wafer pattern fidelity problems caused by other variables in the photolithography process may not be identified. The present disclosure provides an improved method and system for evaluating the mask quality and the effectiveness of the OPC models.

Figure 1:
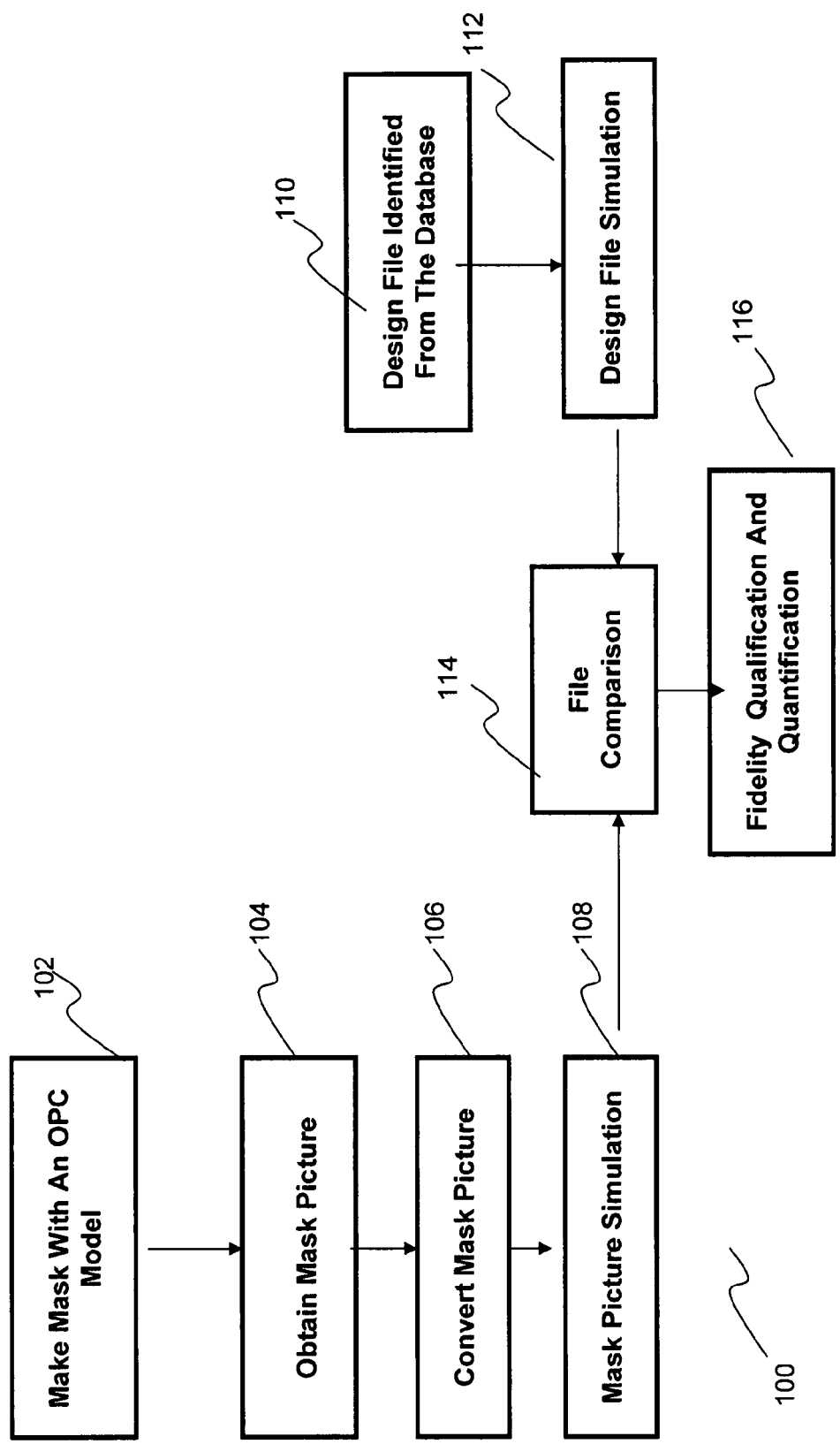
FIG. 1 illustrates a process for conducting a mask pattern fidelity inspection according to one example of the present disclosure.

FIG. 1 illustrates a general process 100 for conducting a mask pattern fidelity inspection according to one example of the present disclosure. Starting from a mask design in a database, a selected OPC model is applied to make a mask through an actual mask making process (step 102). A graphical image of the physical mask is obtained in step 104 through a selected standard tool such as a critical dimension scanning electron microscope (CDSEM). The graphical image, whatever the format it is in, may be referred to generally as a mask picture. Through the assistance of available standard software, the mask picture derived from the physical mask can then be converted into a simulation required digital file in step 106 such as a GDS file. This simulation required digital file may be referred to simply as a "mask based simulation file". A simulation is conducted using this simulation file under a set of predetermined photolithography process conditions (step 108). The result of the simulation will render certain two dimensional and three dimensional wafer resist profile images. In addition, if desired, an aerial image is also obtainable to represent the wafer resist profile. The wafer resist profile images and/or aerial image may be collectively referred to as the "real mask simulation result."

On the other hand, a layout of the mask design from a database corresponding to the physical mask is identified in step 110, and the same OPC model as used in making the mask is applied to the design layout to generate a digital mask file. The digital file may be referred to as the "design based simulation file." The simulation file from the design is then simulated in step 112 with the same photolithography process conditions used for the mask picture simulation in step 108. Similarly, the result of the simulation will render certain two dimensional and three dimensional wafer resist profile images, and/or an aerial image. They are referred to as the "ideal mask simulation result."

The real and ideal mask simulation results are then compared in step 114 to obtain quantitative evaluation of the fidelity problem of the mask for the particular OPC model. The simulation results can be compared in various ways so that the mask fidelity problems are quantified and qualified (step 116). For example, coordinates of correlated points on simulation results derived from the ideal and real masks can be compared. A threshold can be set to identify errors that will cause fidelity problems on the wafer. Through this method, the differences in the "wafer results" can be identified that are caused by the difference between the ideal mask and actual mask. Further, if "unacceptable" areas within the total area of the wafer is bigger than a predetermined threshold, the OPC model or/and the particular mask making process applied can be viewed as unacceptable. It is also noted that the comparison can be done to a portion or a particular feature of the mask, but it can also be applied globally to the entire mask.

Figure 2:
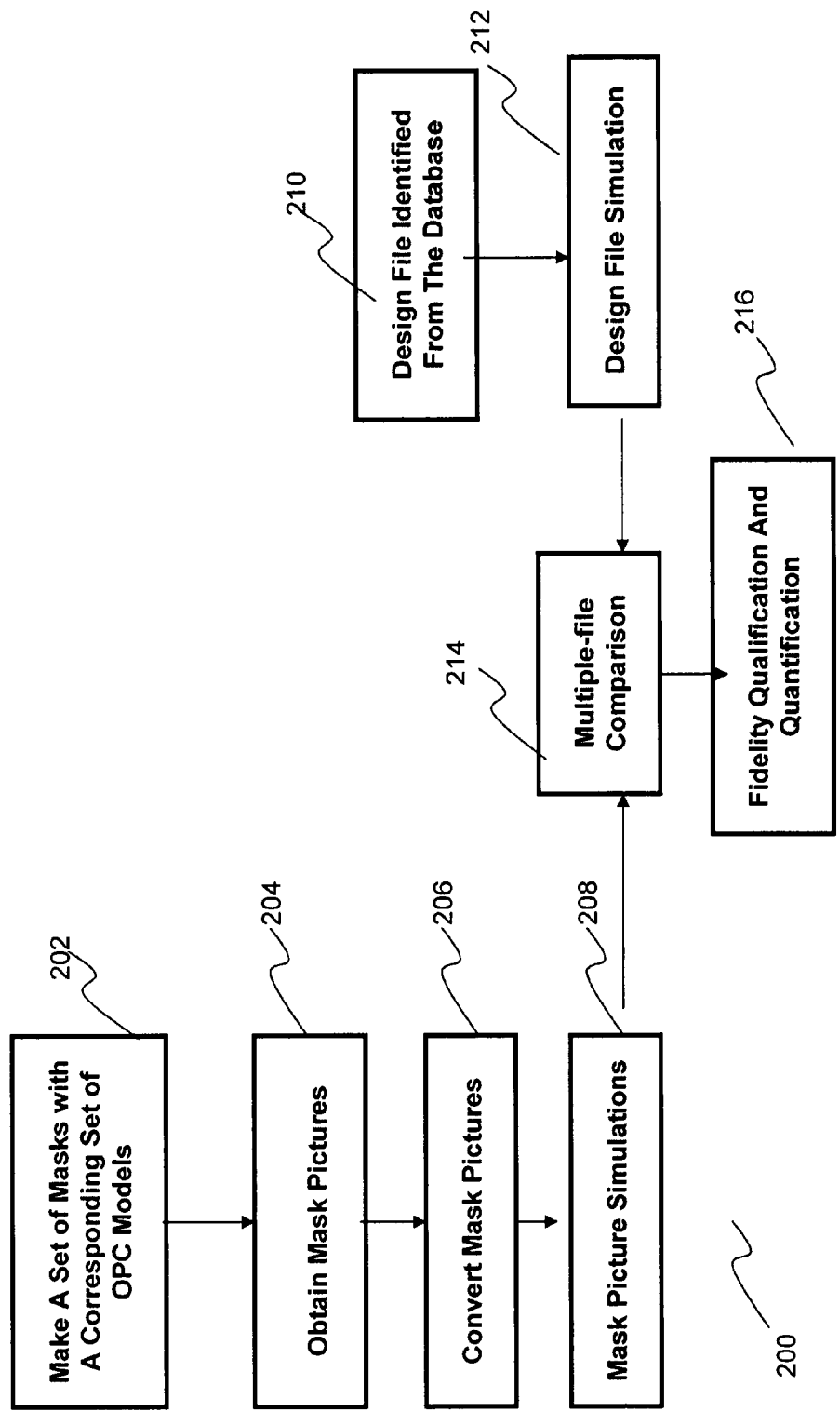
FIG. 2 illustrates a process for conducting a mask pattern fidelity inspection with a plurality of OPC models according to another example of the present disclosure.

FIG. 2 is a process 200 for comparing a plurality of OPC models to determined which one should be applied resulting in the best actual mask corresponding to a particular mask design. It would also determine which OPC models are unusable under a set of predetermined mask making process conditions. In step 202, a selected set of OPC models are applied to make a set of masks through an actual mask making process. A graphical image for each of the physical masks is obtained in step 204 through a selected tool such as a critical dimension scanning electron microscope (CD-SEM). Through the assistance of available standard software, the mask pictures derived from the physical masks can then be converted into simulation required digital files in step 206 (e.g., GDS files). The simulation required digital files are referred to as a "mask based simulation files." A simulation is conducted using each mask based simulation file under a set of predetermined photolithography process conditions (step 208). The result of each simulation will render certain two dimensional and three dimensional wafer resist profile images. In addition, if desired, an aerial image is also obtainable. The wafer resist profile images and/or aerial image are collectively referred to as the "real mask simulation result." On the other hand, a layout of the mask design from a database corresponding to the physical mask is identified in step 210, and the same OPC models as used in making the mask are applied to the design layout to generate a set of digital mask files. The digital mask files may be referred to as the "design based simulation files." The design based simulation files are then simulated in step 212 with the same photolithography process conditions used for the mask picture simulation in step 208.

At this point, a set of real mask simulation results corresponding to the same mask design have been obtained. The differences are largely caused by the different OPC models applied. When evaluating the results, they can be each compared against the corresponding mask simulation result. They can also be subject to a "horizontal" comparison in which relative "aggressiveness" of the OPC models are clearly identified. Through this process, the best OPC model may be identified that is suitable to a particular mask making process.

It is further noted that the present method can also be applied to detect a best mask making process by comparing various masks sharing the same design database and OPC model but having different mask making process variables. The mask making process include variables that can affect the end result of the finished mask. For example, various writing tools such as an E-Beam writer or optical writer, and their respective writing conditions such as exposure dosage or writing sequence can introduce variables that affect the resulting mask. Other processes also contribute to the fidelity of the mask. A post exposure or post resist developing baking may contribute to the uncertainty of the mask fidelity based on baking time, temperature, baking mode, etc. In a resist developing process, the developing time, chuck speed, developing mode can all be variables. An etching process can have more variables such as the etching gases used, pressure, power, etc.

Figure 3:
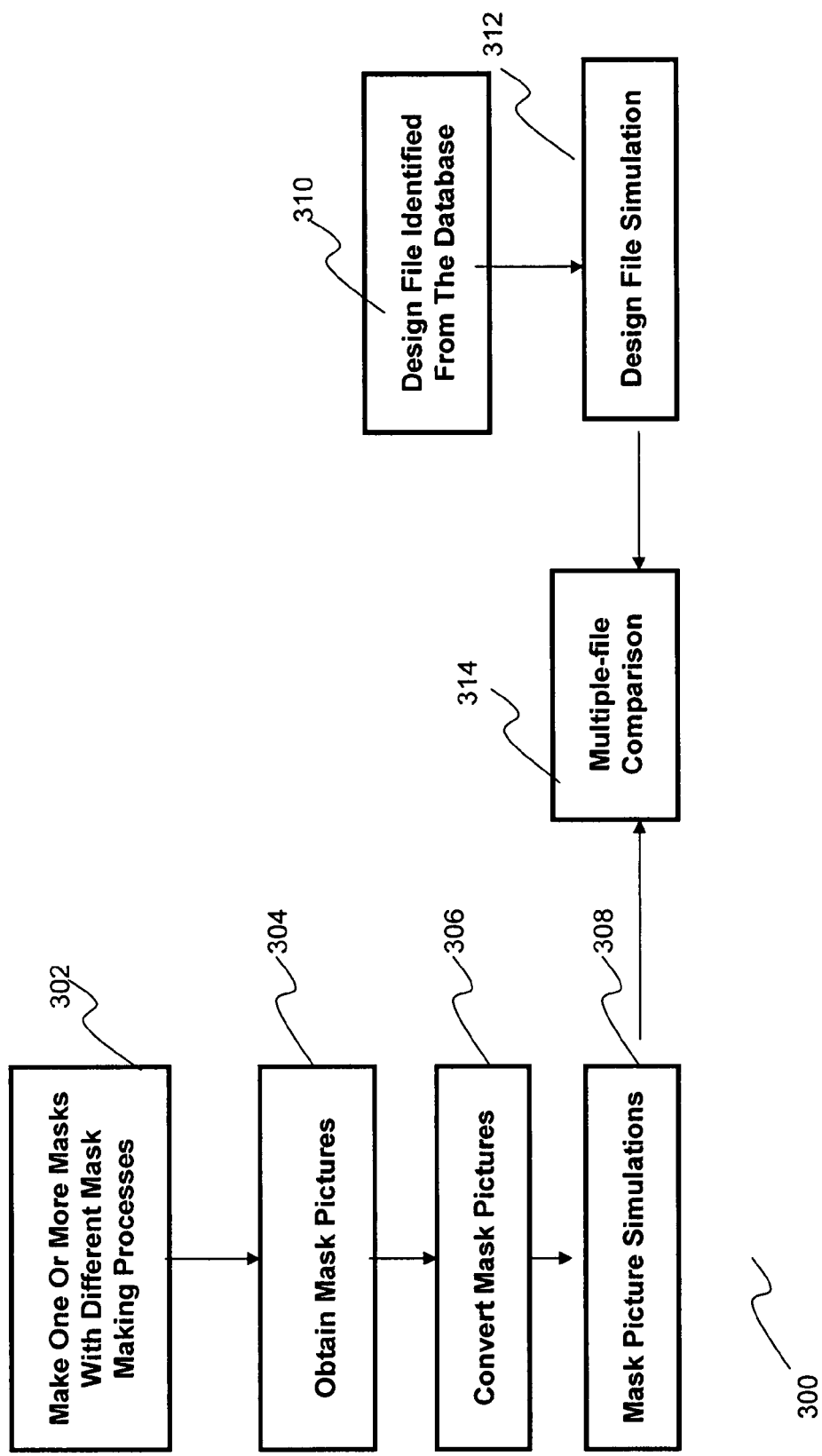
FIG. 3 illustrates a process for conducting a mask pattern fidelity inspection for evaluating the mask, making process according to one example of the present disclosure.

FIG. 3 illustrate a process for evaluating the mask making process 300. A set of masks are made in step 302, with each one of them having variables specifically controlled in the mask making process that are different than others. Respective mask pictures can be obtained in step 304, and mask based simulation files are made therefrom in step 306. Simulations are conducted in step 308 to extract wafer resist profiles based on these different mask basked simulation files. From the mask design end, the design file is identified and the same OPC model is applied in step 310, and a separate simulation is conducted in step 312. These simulations are evaluated against each other in step 314 to identify a preferred mask making process for the mask design used.

As such, the disclosed method and system can detect which mask is the best among all in terms of mask fidelity, the best OPC model, as well as the best mask making process. Various benefits are achieved over conventional approaches. For example, it separates possible errors caused purely by processes for making the mask from other errors caused by other photolithography processes when using the actual mask. By using this method, the fidelity problem caused by the mask itself can be clearly identified, and a best OPC model or a best mask can be selected for final manufacturing need.

The above disclosure provides many different embodiments, or examples, for implementing different features of the invention. Specific examples of components, and processes are described to help clarify the invention. These are, of course, merely examples and are not intended to limit the invention from that described in the claims.

While the invention has been particularly shown and described with reference to the preferred embodiment thereof, it will be understood by those skilled in the art that various changes in form and detail may be made therein without departing from the spirit and scope of the invention, as set forth in the following claims.

What is claimed is:

1. A mask fidelity inspection method comprising:
generating a first mask picture from a first mask, the first mask being made from a predetermined mask design with a first optical proximity correction (OPC) model applied thereto;
generating a second mask picture from a second mask, the second mask being made from the predetermined mask design with a second OPC model applied thereto;
converting the first and second mask pictures into a first and second mask based simulation files;
conducting a first simulation session under predetermined photolithography processing conditions using the first mask based simulation file to generate one or more files representing a first wafer photo resist profile thereof;
conducting a second simulation session under the predetermined photolithography processing conditions using the second mask based simulation file to generate one or more files representing a second wafer photo resist profile thereof;
applying the first and second OPC models to the predetermined mask design in a database mask file format;
conducting a third simulation under the predetermined photolithography processing conditions using the mask design with the first OPC model to generate one or more files representing an expected wafer photo resist profile thereof;
conducting a fourth simulation under the predetermined photolithography processing conditions using the mask design with the second OPC model to generate one or more files representing an expected wafer photo resist profile thereof;
evaluating the first, second, third and fourth wafer photo resist profiles;
selecting one of the first and second OPC models for use under the predetermined photolithography processing conditions based on the evaluating; and
outputting the selected OPC model to a computer readable storage medium, wherein the evaluating includes setting one or more parameter thresholds of the wafer photo resist profiles for identifying the effectiveness of the first or second OPC model with regard to the photolithography processing conditions.

2. The method of claim 1 wherein the evaluating further includes identifying relative aggressiveness of the first and second OPC models.

3. The method of claim 1 wherein the wafer photo resist profiles are aerial images.

4. The method of claim 1 wherein the files of the first, second, third, or fourth wafer photo resist profile thereof include two-dimension wafer resist profile simulation files.

5. The method of claim 1 wherein the files of the first, second, third, or fourth wafer photo resist profile thereof include three-dimension wafer resist profile simulation files.

6. The method of claim 1 wherein the evaluating step further includes a horizontal comparison step.

7. A system for mask fidelity inspection comprising:
an image capturing tool configured to generate a first mask picture from a first mask being made from a predetermined mask design with a first OPC model applied thereto and a second mask picture from a second mask being made from the predetermined mask design with a second OPC model applied thereto;
a storage medium coupled to the image capturing tool, the storage medium configured to store database mask files used for generating the first mask and the second mask;
a first processing tool coupled to the storage medium, the first processing tool configured to convert the first mask picture and the second mask picture into a first mask based simulation file and a second mask based simulation file, respectively;
a second processing tool coupled to the storage medium, the second processing tool configured to apply the first OPC model to the predetermined mask design and the second OPC model to the predetermined mask design;
a simulation tool coupled to the storage medium, the simulation tool configured to conduct a first simulation under a predetermined lithography processing conditions using the first mask based simulation file to generate one or more files representing a first wafer photo resist profile thereof; to conduct a second simulation under the predetermined lithography processing conditions using the second mask based simulation file to generate one or more files representing a second wafer photo resist profile thereof; to conduct a third simulation under the predetermined photolithography processing conditions using the mask design with the first OPC model to generate one or more files representing a third wafer photo resist profile thereof; and to conduct a fourth simulation under the predetermined photolithography processing conditions using the mask design with the second OPC model to generate one or more files representing a fourth wafer photo resist profile thereof; and
a comparison tool coupled to the storage medium, the comparison tool configured to compare the first and third wafer photo resist profiles and the second and fourth wafer photo resist profiles so as to select one of the first and second OPC models for use with the predetermined photolithography processing conditions, and the comparison tool including means for setting one or more parameter thresholds of the wafer photo resist profiles for identifying the effectiveness of the first or second OPC model with regard to the photolithography processing conditions.

8. The system of claim 7 wherein the comparison tool further includes means for setting one or more parameter thresholds of the wafer photo resist profiles for identifying the effectiveness of the first or second OPC model with regard to the photolithography processing conditions. means for setting one or more parameter thresholds of the wafer photo resist profiles for identifying the effectiveness of the first or second OPC model with regard to the photolithography processing conditions.

9. The system of claim 7 wherein the wafer photo resist profiles are aerial images.

10. The system of claim 7 wherein the files representing the first, second, third, and fourth wafer photo resist profile include two-dimension wafer resist profile simulation files.

11. The system of claim 7 wherein the files representing the first, second, third, and fourth wafer photo resist profile include three-dimension wafer resist profile simulation files.

12. The system of claim 7 wherein the comparison tool is further configured to conduct a horizontal comparison step.

* * * * *

UNITED STATES PATENT AND TRADEMARK OFFICE
CERTIFICATE OF CORRECTION

| | | |
|---|---|---|
| PATENT NO. | : 7,383,530 B2 | Page 1 of 1 |
| APPLICATION NO. | : 11/786978 | |
| DATED | : June 3, 2008 | |
| INVENTOR(S) | : Wen-Chuan Wang et al. | |

It is certified that error appears in the above-identified patent and that said Letters Patent is hereby corrected as shown below:

Column 8, lines 47-51, delete "means for setting ... conditions." (second occurrence).

Signed and Sealed this

Twelfth Day of August, 2008

JON W. DUDAS
*Director of the United States Patent and Trademark Office*